US011152764B1

(12) United States Patent
Morrison et al.

(10) Patent No.: US 11,152,764 B1
(45) Date of Patent: Oct. 19, 2021

(54) GRATINGS FOR HIGH POWER SINGLE MODE LASER

(71) Applicant: Freedom Photonics LLC, Goleta, CA (US)

(72) Inventors: Gordon Barbour Morrison, Summerland, CA (US); Bob Benjamin Buckley, Santa Barbara, CA (US)

(73) Assignee: Freedom Photonics LLC, Goleta, CA (US)

( * ) Notice: Subject to any disclaimer, the term of this patent is extended or adjusted under 35 U.S.C. 154(b) by 0 days.

(21) Appl. No.: 16/688,908

(22) Filed: Nov. 19, 2019

Related U.S. Application Data

(60) Provisional application No. 62/769,992, filed on Nov. 20, 2018.

(51) Int. Cl.
*H01S 5/12* (2006.01)
*H01S 5/10* (2021.01)
*H01S 5/125* (2006.01)

(52) U.S. Cl.
CPC .......... *H01S 5/1228* (2013.01); *H01S 5/1003* (2013.01); *H01S 5/125* (2013.01)

(58) Field of Classification Search
CPC ....... H01S 5/1228; H01S 5/1003; H01S 5/125
USPC .......................................... 385/37
See application file for complete search history.

(56) References Cited

U.S. PATENT DOCUMENTS

| | | | |
|---|---|---|---|
| 8,401,399 B2 | 3/2013 | Barton et al. | |
| 8,401,405 B2 | 3/2013 | Barton et al. | |
| 8,712,256 B2 | 4/2014 | Barton et al. | |
| 8,718,486 B2 | 5/2014 | Barton et al. | |
| 9,246,596 B2 | 1/2016 | Barton et al. | |
| 9,270,380 B2 | 2/2016 | Barton et al. | |
| 9,344,196 B1 | 5/2016 | Mashanovitch et al. | |
| 9,887,780 B2 | 2/2018 | Barton et al. | |
| 9,941,971 B1 | 4/2018 | Mashanovitch et al. | |
| 10,320,152 B2 | 6/2019 | Morrison | |
| 10,355,451 B2 | 7/2019 | Morrison et al. | |
| 2005/0230695 A1* | 10/2005 | Takayama | H01L 33/06 257/94 |
| 2006/0093012 A1* | 5/2006 | Singh | H01S 5/141 372/102 |
| 2006/0187995 A1* | 8/2006 | Peters | H01S 5/12 372/96 |
| 2011/0243175 A1* | 10/2011 | Evans | H01S 5/1206 372/50.11 |
| 2014/0363127 A1* | 12/2014 | Baets | G02B 6/29326 385/37 |

(Continued)

OTHER PUBLICATIONS

Donnelly, et al., "AlGaAs-InGaAs Slab-Coupled Optical Waveguide Lasers," IEEE Journal of Quantum Electronics, vol. 29, No. 2, Feb. 2003; 10 pages.

(Continued)

*Primary Examiner* — Jerry M Blevins
(74) *Attorney, Agent, or Firm* — Knobbe, Martens, Olson & Bear, LLP

(57) ABSTRACT

An optical device is provided that includes a waveguide layer and at least one grating structure. A coupling coefficient of the at least one grating structure to a fundamental optical mode supported by the waveguide layer is greater than a coupling coefficient of the at least one grating structure to at least one higher order transverse optical mode supported by the waveguide layer.

30 Claims, 12 Drawing Sheets

(56) References Cited

U.S. PATENT DOCUMENTS

| | | | | |
|---|---|---|---|---|
| 2015/0270684 | A1* | 9/2015 | Suzuki | H01S 5/1237 372/45.012 |
| 2019/0386463 | A1 | 12/2019 | Morrison | |
| 2020/0183195 | A1 | 6/2020 | Morrison | |

OTHER PUBLICATIONS

Juodawlis, et al., "High-Power 1.5-µm InGaAsP-lnP Slab-Coupled Optical Waveguide Amplifier," IEEE Photonics Technology Letters, vol. 17, No. 2, Feb. 2005; 3 pages.

Juodawlkis, et al., "Continuous-wave two-photon absorption in a Watt-class semiconductor optical amplifier," Optics Express, vol. 16, No. 16, Aug. 4, 2008; 10 pages.

Juodawlkis, et al., "High-Power, Low-Noise 1.5-µm Slab-Coupled Optical Waveguide (SCOW) Emitters: Physics, Devices, and Applications," IEEE Journal of Selected Topics in Quantum Electronics, vol. 17, No. 6, Nov./Dec. 2011; 17 pages.

Juodawlkis, et al., "High-Power, Low-Noise Slab-Coupled Optical Waveguide (SCOW) Amplifiers and Lasers," Optical Society of America, OFC/NFOEC 2011; 3 pages.

Juodawlkis, et al., "High-Power, Ultralow-Noise Semiconductor External Cavity Lasers Based on Low-Confinement Optical Waveguide Gain Media," Proc. Of SPIE, vol. 7616; 10 pages.

Juodawlkis, et al., "Ultralow-Noise Packaged 1.55-µm Semiconductor External-Cavity Laser with 0.37-W Output Power," Optical Society of America, CLEO/IQEC 2009; 3 pages.

Juodawlkis, Paul W. and Plant, Jason J., "Gain-Power Trade-Off in Low-Confinement Semiconductor Optical Amplifiers," IEEE NUSOD 2007; CPDA3, 2 pages.

Klamkin, et al., "High-Output Saturation Power Variable Confinement Slab-Coupled Optical Waveguide Amplifier," Optical Society of America, OFC/NFOEC 2011; 3 pages.

Liang, et al., "High-Efficiency Oxide-Confined Ridge Waveguide Laser with Nearly Symmetric Output Beam," IEEE 2006; 2 pages.

Loh, et al., "Noise Figure of Watt-Class Ultralow-Confinement Semiconductor Optical Amplifiers," IEEE Journal of Quantum Electronics, vol. 47, No. 1, Jan. 2011; 10 pages.

Loh, et al., "Packaged, High-Power, Narrow-Linewidth Slab-Coupled Optical Waveguide External Cavity Laser (SCOWECL)," IEEE Photonics Technology Letters, vol. 23, No. 14, Jul. 15, 2011; 3 pages.

Madison, et al., "Slab-Coupled Optical Waveguide Photodiode," Optical Society of America, CLEO/QELS 2008; 2 pages.

Marcatili, E. A. J., "Slab-Coupled Waveguides," The Bell System Technical Journal, vol. 53, No. 4, Apr. 1974; 30 pages.

Pietrzak, et al., "Combination of Low-Index Quantum Barrier and Super Large Optical Cavity Designs for Ultranarrow Vertical Far-Fields From High-Power Broad-Area Lasers," IEEE Journal of Selected Topics in Quantum Electronics, vol. 17, No. 6, Nov./Dec. 2011; 8 pages.

Ru, et al., "Robust slab-coupled buried-rub semiconductor laser with high fibre coupling efficiency," IEE, Sep. 27, 2004; 2 pages.

Ryvkin, B.S. and Avrutin, E.A., "Effect of carrier loss through waveguide layer recombination of the internal quantum efficiency in large-optical-cavity laser diodes," Journal of Applied Physics 97, 113106, 2005; 6 pages.

Walpole, et al., "Slab-Coupled 1.3-µm Semiconductor Laser With Single-Spatial Large-Diameter Mode," IEEE Photonics Technology Letters, vol. 14, No. 6, Jun. 2002; 3 pages.

Beck, et al., "Buried Heterostructure Quantum Cascade Lasers with a Large Optical Cavity Waveguide," IEEE Photonics Technology Letters, vol. 12, No. 11, Nov. 2000; 3 pages. pp. 1450-1452.

* cited by examiner

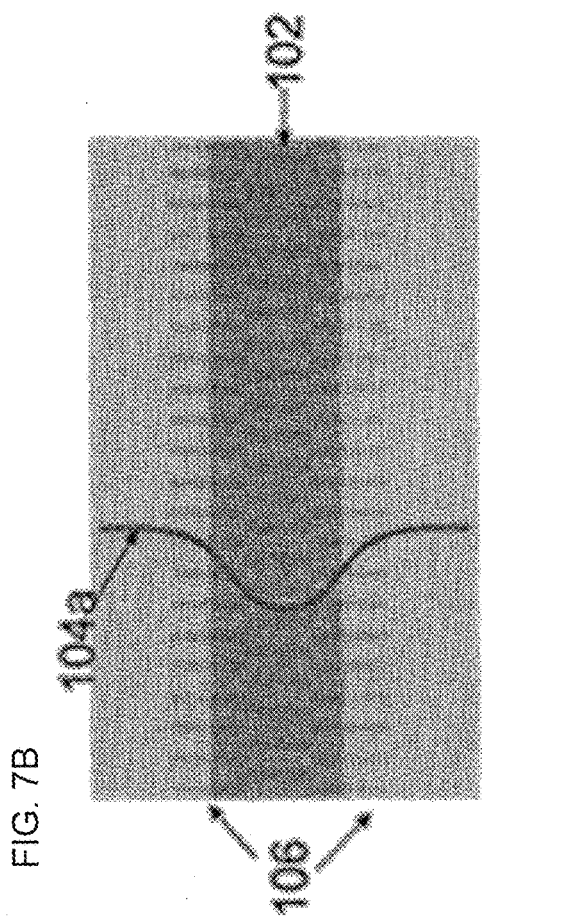
FIG. 7B
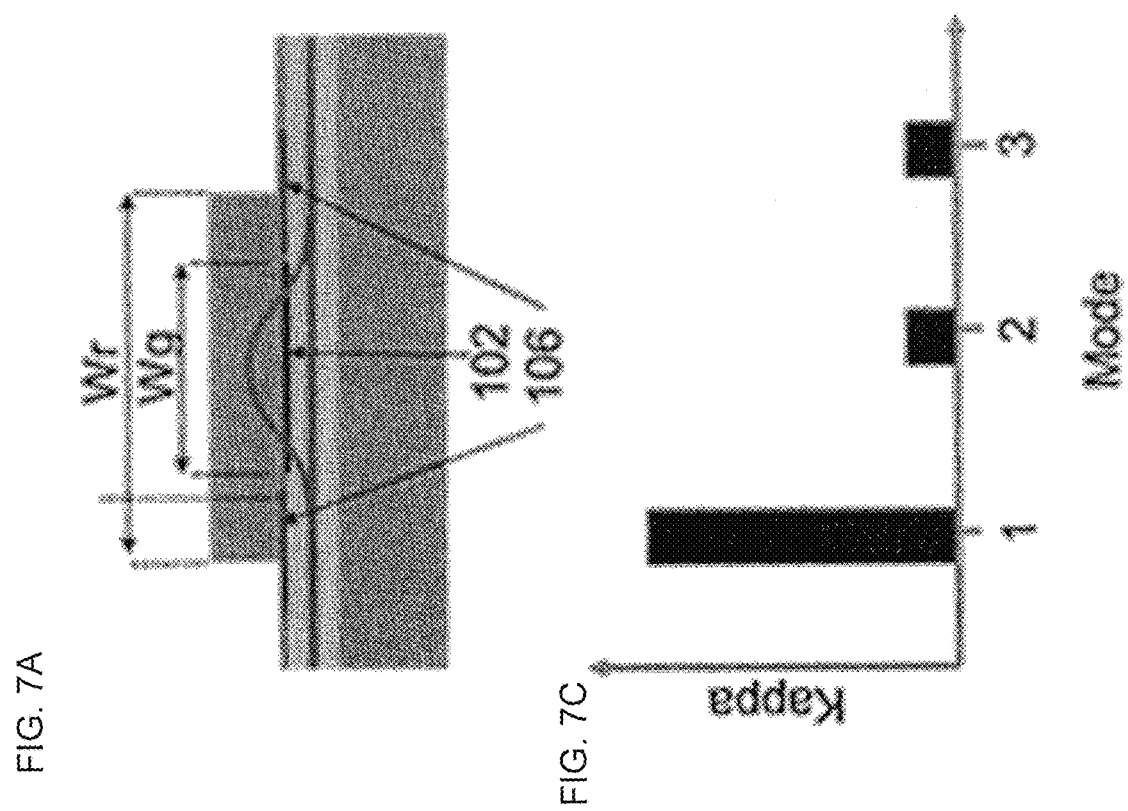
FIG. 7A
FIG. 7C

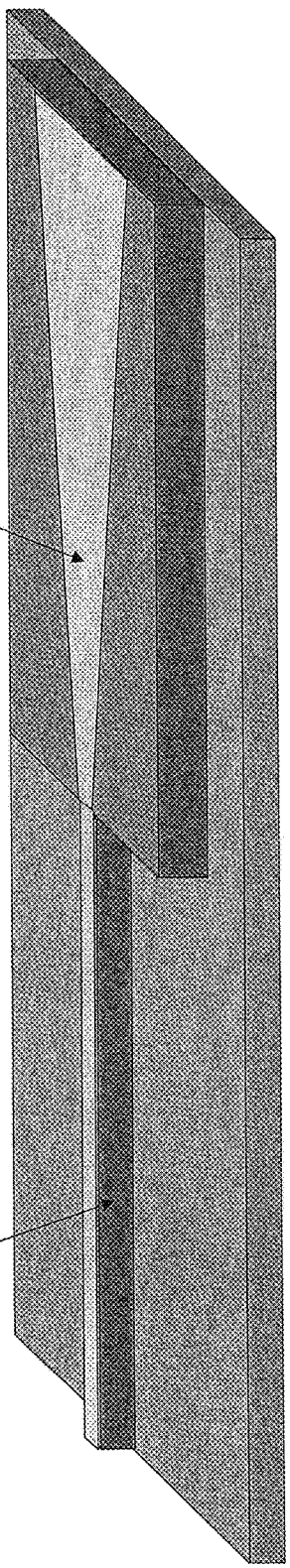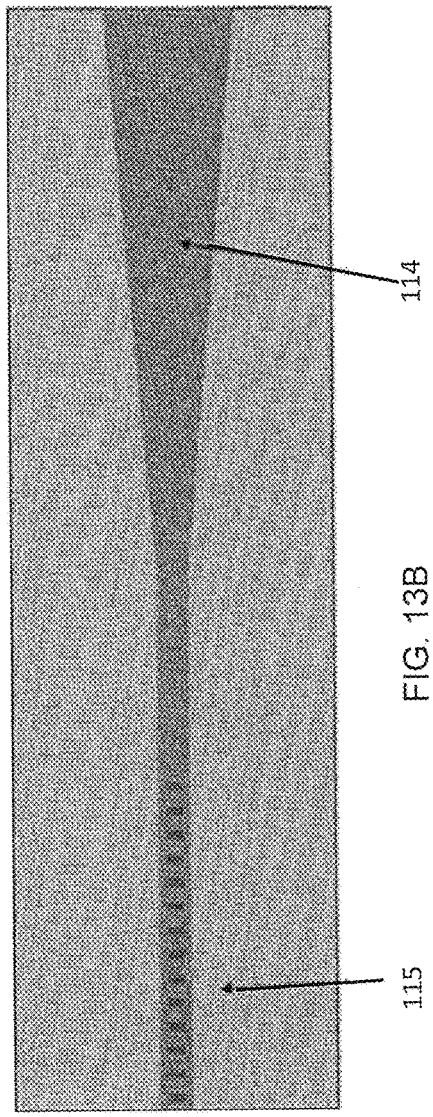
FIG. 13A
FIG. 13B

GRATINGS FOR HIGH POWER SINGLE MODE LASER

CLAIM OF PRIORITY

This application claims the benefit of priority to U.S. Provisional Appl. No. 62/769,992 filed on Nov. 20, 2018, which is incorporated in its entirety by reference herein.

BACKGROUND

Field

Various embodiments of this application relate to the field of single-mode lasers.

Description of the Related Art

Lasers are widely used in telecommunications, sensing, and test and measurement applications. Many high-power lasers are not single-mode while many single-mode lasers do not provide high optical powers.

SUMMARY

Systems and methods that enable an optical transmitter capable of generating optical signals with various modulation formats may be beneficial in optical networks and systems. Example embodiments described herein have several features, no single one of which is indispensable or solely responsible for their desirable attributes. Without limiting the scope of the claims, some of the advantageous features will now be summarized.

Embodiment 1: A laser comprising: a substrate comprising: an active layer comprising a waveguide, the active layer configured to support a fundamental optical mode and at least one higher order transverse optical mode; and at least one grating structure, wherein a coupling coefficient of the at least one grating structure to the fundamental optical mode is greater than a coupling coefficient of the at least one grating structure to at least one higher order transverse optical mode.

Embodiment 2: The laser of Embodiment 1, further comprising a ridge over the active layer comprising the waveguide, the ridge having a width $W_r$, the ridge comprising a material having a lower refractive index than does the waveguide.

Embodiment 3: The laser of Embodiments 1-2, wherein the at least one grating structure has a width $W_g$ less than the width of the ridge $W_r$.

Embodiment 4: The laser of Embodiments 2-3, wherein the at least one grating structure is disposed in a central region of the ridge.

Embodiment 5: The laser of Embodiments 2-4, further comprising at least one secondary grating structure disposed in an edge portion of the ridge spaced apart from the at least one grating structure.

Embodiment 6: The laser of Embodiment 5, wherein reflection of light from the at least one secondary grating structure is configured to be out of phase with reflection of light from the at least one grating structure.

Embodiment 7: The laser of Embodiments 2-6, wherein the at least one grating structure is between the active layer and the ridge.

Embodiment 8: The laser of Embodiments 2-7, further comprising a confinement reduction layer surrounding the ridge, the confinement reduction layer having a height smaller than a height of the ridge, the confinement reduction layer comprising a material having a refractive index layer lower than the refractive index of the material of the waveguide.

Embodiment 9: The laser of Embodiment 8, wherein a height of the confinement reduction layer is configured to reduce lateral confinement for some of the at least one higher order transverse optical mode.

Embodiment 10: The laser of Embodiments 1-9, wherein the at least one grating structure has a width $W_g$ less than a width of the active layer $W_a$.

Embodiment 11: The laser of Embodiment 1-9, wherein the at least one grating structure comprises a curved grating.

Embodiment 12: An optical device comprising: a waveguide layer configured to support a fundamental optical mode and at least one higher order transverse optical mode; and at least one grating structure, wherein a coupling coefficient of the at least one grating structure to the fundamental optical mode is greater than a coupling coefficient of the at least one grating structure to at least one higher order transverse optical mode.

Embodiment 13: The optical device of Embodiment 12, further comprising an active region including the waveguide layer.

Embodiment 14: The laser of any of Embodiments 1-11 or the optical device of Embodiments 12-13, wherein a width $W_g$ of the at least one grating structure is configured such that the coupling coefficient of a fundamental transverse optical mode to the at least one grating structure is greater than the coupling coefficient of other higher order optical modes to the at least one grating structure.

Embodiment 15: The laser of any of Embodiments 1-11 or the optical device of Embodiments 12-13, wherein a width $W_g$ of the at least one grating structure is configured such that the coupling coefficient of one transverse optical mode to the at least one grating structure is greater than the coupling coefficient of other transverse optical modes to the at least one grating structure.

Embodiment 16: The laser of Embodiment 1 or the optical device of Embodiment 12, wherein the at least one grating structure comprises a plurality of parallel grating structures configured to preferentially select a single transverse optical mode.

Embodiment 17: The laser of Embodiment 16 or the optical device of Embodiment 16, wherein different grating structures from the plurality of parallel grating structures have a phase difference.

Embodiment 18: The laser of Embodiments 16-17 or the optical device of Embodiments 16-17, further comprising a ridge over the waveguide, the ridge having a width $W_r$, wherein the ridge comprises a material having a first refractive index lower than a second refractive index of the waveguide.

Embodiment 19: The laser of Embodiment 18 or the optical device of Embodiment 18, further comprising a confinement reduction layer surrounding the ridge, wherein a distance of a top surface of the confinement reduction layer from the waveguide layer is less than a distance of a top surface of the ridge from the waveguide.

Embodiment 20: The laser of Embodiment 19 or the optical device of Embodiment 19, wherein the confinement reduction layer is configured to reduce a number of transverse optical modes.

Embodiment 21: The laser or the optical device of any of the Embodiments above, comprising a semiconductor.

Embodiment 22: The laser or the optical device of any of the Embodiments above, wherein the waveguide layer comprises at least one of a ridge waveguide, a buried heterostructure, a buried stripe or an in-plane semiconductor waveguide.

Embodiment 23: The laser or the optical device of any of the Embodiments above, wherein the at least one grating structure comprises grating elements that are configured to diffract light in one or more transverse optical modes along a direction normal to a top surface of the ridge such that light in the one or more transverse optical modes is not coupled out of the laser.

Embodiment 24: The laser or the optical device of any of the Embodiments above, comprising at least one of a distributed feedback (DFB) laser, a distributed Bragg reflector (DBR) laser, a sampled grating DBR laser, a semiconductor optical amplifier, an electro-absorption modulator, a Mach Zehnder modulator, a tapered waveguide layer or a flared optical power amplifier.

Embodiment 25: The laser or the optical device of any of the Embodiments above, wherein the waveguide layer comprises the at least one grating structure.

Embodiment 26: The laser or the optical device of any of the Embodiments above, wherein the waveguide layer comprises silicon on insulator, silicon on doped glass, or silicon nitride (SiN).

Embodiment 27: The laser or the optical device of any of the Embodiments above, wherein the at least one grating structure is configured to couple preferentially to one or more higher order transverse optical modes than the fundamental mode.

Embodiment 28: The laser or the optical device of any of the Embodiments above, wherein the at least one grating structure comprises a second order grating having 50% duty cycle configured to increase optical loss for higher order transverse optical modes as compared to the fundamental mode so that the fundamental mode is preferentially selected to laser.

Embodiment 29: The laser or the optical device of any of the Embodiments above, wherein the waveguide layer comprises at least one of a ridge waveguide, a buried heterostructure, a ridge waveguide etched completely through the active region, or any other waveguide architecture suitable for propagating a laser mode.

Embodiment 30: The laser or the optical device of any of the Embodiments above, wherein the at least one grating structure is within the active layer.

Embodiment 31: The laser or the optical device of any of the Embodiments above, wherein the grating layer is below the active layer.

Embodiment 32: The laser or the optical device of any of the Embodiments above, further comprising an additional etch-stop layer configured to allow selective etching of a cladding layer provided over the waveguide to obtain a ridge and a confinement reduction layer.

Embodiment 33: The laser or the optical device of Embodiment 33, wherein a thickness of the confinement reduction layer is controlled by a position of the etch-stop layer.

Embodiment 34: The laser or the optical device of Embodiments 33-34, wherein ion-implantation is used to increase electrical resistance of one or more regions of the confinement reduction layer.

Embodiment 35: The laser or the optical device of any of the Embodiments above, wherein the average effective refractive index in the at least one grating structure can be either higher or lower than the average refractive index in areas surrounding the at least one grating structure.

Embodiment 36: The laser or the optical device of any of the Embodiments above, wherein the average effective refractive index in the at least one grating structure is tailored by selecting materials having a desired value of refractive index and/or by use of positive or negative masks for manufacturing the at least one grating structure.

Embodiment 37: The laser or the optical device of any of the claims above, wherein the waveguide layer comprises a semiconductor.

Embodiment 38: The laser or the optical device of any of the claims above, wherein at least 50% of the at least one grating structure is disposed beneath the ridge.

BRIEF DESCRIPTION OF THE DRAWINGS

In the following description of the various embodiments, reference is made to the accompanying drawings which form a part hereof, and in which is shown by way of illustration various embodiments of the device.

It is to be understood that other embodiments can be utilized and structural changes can be made without departing from the scope of present invention.

FIGS. 7A-7B schematically illustrates a cross-sectional view and a top view, respectively of an example ridge waveguide laser having a primary grating with a grating width less than the ridge width and secondary gratings spaced apart from the primary gratings in accordance with certain embodiments described herein. FIG. 7C graphically illustrates the effective coupling coefficient for different transverse laser modes.

FIGS. 13A-13B schematically illustrate a perspective view and a top view, respectively, of an example distributed feedback (DFB) laser optically coupled to an optical amplifier in accordance with certain embodiments described herein.

Figure 1:
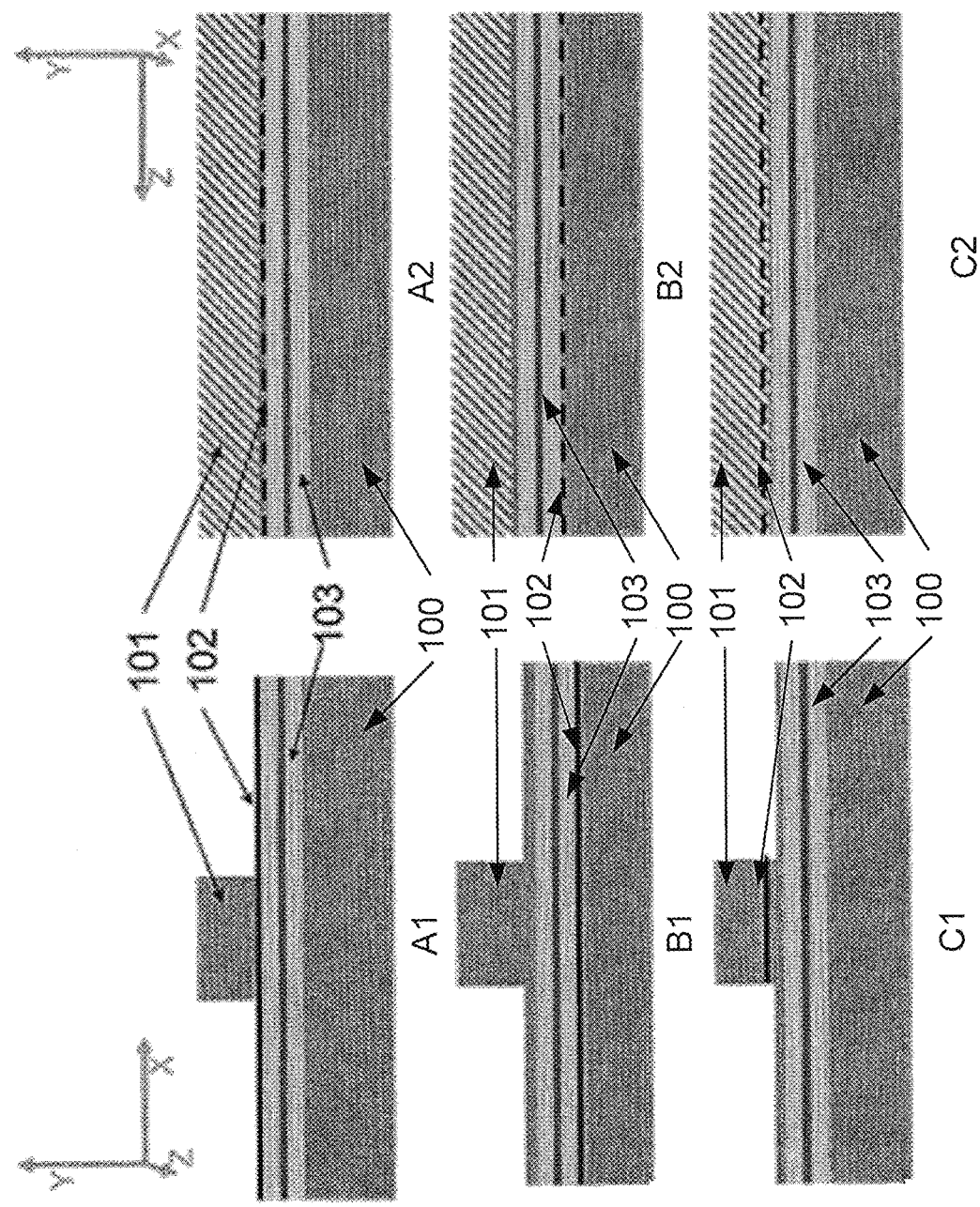
FIG. 1 schematically illustrates two views of various example ridge waveguide lasers in accordance with certain embodiments described herein.

These and other features will now be described with reference to the drawings summarized above. The drawings and the associated descriptions are provided to illustrate embodiments and not to limit the scope of the disclosure or claims. Throughout the drawings, reference numbers may be reused to indicate correspondence between referenced elements. In addition, where applicable, the first one or two digits of a reference numeral for an element can frequently indicate the figure number in which the element first appears.

DETAILED DESCRIPTION

Although certain preferred embodiments and examples are disclosed below, inventive subject matter extends beyond the specifically disclosed embodiments to other alternative embodiments and/or uses and to modifications and equivalents thereof. Thus, the scope of the claims appended hereto is not limited by any of the particular embodiments described below. For example, in any method or process disclosed herein, the acts or operations of the method or process can be performed in any suitable sequence and are not necessarily limited to any particular disclosed sequence. Various operations can be described as multiple discrete operations in turn, in a manner that can be helpful in understanding certain embodiments; however, the order of description should not be construed to imply that these operations are order dependent. Additionally, the structures, systems, and/or devices described herein can be embodied using a variety of techniques including techniques that may not be described herein but are known to a person having ordinary skill in the art. For purposes of comparing various embodiments, certain aspects and advantages of these embodiments are described. Not necessarily all such aspects or advantages are achieved by any particular embodiment. Thus, for example, various embodiments can be carried out in a manner that achieves or optimizes one advantage or group of advantages as taught herein without necessarily achieving other aspects or advantages as may also be taught or suggested herein.

It will be understood that when an element or component is referred to herein as being "connected" or "coupled" to another element, it can be directly connected or coupled to the other element or intervening elements can be present therebetween. For clarity of description, "reflector" or "mirror" can be used interchangeably to refer to an optical element and/or a surface having a reflectivity greater than or equal to about 0.01% and less than or equal to 100%. For example, an optical element and/or a surface having a reflectivity greater than or equal to about 5% and less than or equal to 99%, greater than or equal to about 10% and less than or equal to 90%, greater than or equal to about 15% and less than or equal to 80%, greater than or equal to about 20% and less than or equal to 70%, greater than or equal to about 30% and less than or equal to 60%, or any value in any range/sub-range defined by these values can be considered as a reflector or mirror.

Lasers are of interest in many applications ranging from telecom to sensing and RF photonics. Lasers with narrow linewidths, high side mode suppression ratio (SMSR), low relative intensity noise (e.g., relative intensity noise less than −140 dB) and/or high power (e.g., optical power greater than 10 dBm) can be advantageous in many applications. Many lasers that are configured to output high optical power can be multimode while the optical power output from many lasers that are configured to be single mode can be below 27 dBm. For example, the optical power output from single mode distributed feedback (DFB) lasers can be limited due to effects such as spatial hole burning, spectral hole burning, catastrophic optical damage, carrier leakage, and self-heating (thermal effects). Increasing the width of the waveguide layer is one possible way to increase output optical power. For example, increasing the width of the waveguide layer can increase the cross-sectional area of the waveguide layer and thereby reduce the electrical and optical densities. Furthermore, the wider waveguide layer can have lower resistance, resulting in more efficient current injection and less self-heating, and the larger width also results in better heat transfer for device cooling. However, a waveguide layer with increased width can support multiple transverse modes (e.g., higher order transverse modes) which can be undesirable for many applications.

FIG. 1 shows some examples of ridge waveguide lasers, each comprising a substrate 100. For example, the substrate 100 can include one or more materials selected from the group consisting of: gallium arsenide (GaAs), indium phosphide (InP), sapphire, silicon, gallium nitride (GaN). The ridge waveguide lasers of FIG. 1 further comprise an active region including a waveguide layer 103 over the substrate 100 and a ridge 101 over the active region including the waveguide layer 103. For example, the waveguide layer 103 can comprise one or more materials selected from the group consisting of: indium gallium arsenide phosphide (InGaAsP), any ternary from InGaAsP, aluminum gallium arsenide (AlGaAs), indium aluminum gallium arsenide (InAlGaAs), indium aluminum phosphide (InAlP), indium aluminum gallium arsenide phosphide (InAlGaAsP).

The various lasing modes of the example ridge waveguide lasers of FIG. 1 are confined laterally (e.g., along the x-direction, which in the cross-sectional views in the x-y plane of portions A1-C1 of FIG. 1 extends from the left to the right of the page and which in the cross-sectional views in the y-z plane of portions A2-C2 of FIG. 1 extends out of the page) by the ridge 101 and vertically (e.g., along the y-direction, which in portions A1-C1 and A2-C2 of FIG. 1 extends from the bottom to the top of the page) by the waveguide layer 103. Together the ridge 101 and the waveguide layer 103 form a waveguide that confines the lasing modes vertically and laterally such that the lasing modes propagate along the waveguide layer 103. The ridge 101 can comprise a region of lower refractive index cladding material having a refractive index lower than the refractive index of the waveguide layer 103. In some embodiments, the ridge 101 can comprise a material identical to the material of the substrate 100. The refractive index difference between the material of the ridge 101 and the waveguide layer 103 can be between about 0.02 to 0.7. For example, the refractive index difference between the material of the ridge 101 and the waveguide layer 103 can be between 0.02 and 0.1, between 0.05 and 0.2, between 0.1 and 0.2, between 0.15 and 0.3, between 0.25 and 0.4, between 0.3 and 0.45, between 0.35 and 0.5, or any value in any range defined by any of these values. The ridge 101 can have a width $W_r$ (e.g., along the x-direction) and a height $H_r$ (e.g., along the y-direction).

FIG. 1 schematically illustrates two views of various example ridge waveguide lasers in accordance with certain embodiments described herein. Portions A1-A2 of FIG. 1 schematically illustrate cross-sectional views in the x-y plane and the y-z plane, respectively, of an example ridge waveguide laser with a grating layer 102 below the ridge 101 and above the active region including the waveguide layer 103. Portions B1-B2 of FIG. 1 schematically illustrate cross-sectional views in the x-y plane and the y-z plane, respectively, of an example ridge waveguide laser with a grating layer 102 below the ridge 101 and below the active region including the waveguide layer 103. Portions C1-C2 of FIG. 1 schematically illustrate cross-sectional views in the x-y plane and the y-z plane, respectively, of an example ridge waveguide laser with a grating layer 102 within the ridge 101. In the example ridge waveguide lasers of FIG. 1, the light propagates along the ridge 101 in the z-direction (e.g., out of the page in the views of portions A1-C1 of FIG. 1 and horizontally within the page in the views of portions A2-C2 of FIG. 1).

In portions A2-C2 of FIG. 1, the cross section along the ridge 101 is shown as crosshatched, indicating the region where ridge material has been selectively removed, and the grating layer 102 is shown as a dashed line running along the length of the laser. The ridge 101 is cross hatched to indicate that if the cross section is through the center of the ridge 101, the cladding material is present, but if the cross section is through a region to the side to the ridge 101, then the cladding material is not present. The grating layer 102 can comprise volume or surface gratings. The grating layer 102 can comprise chirped gratings, burst gratings, sampled gratings and/or any combination of one or more of chirped gratings, burst gratings or sampled gratings. The wavelength of the light emitted from the ridge waveguide laser is determined by the size and spacing between the individual diffracting elements of the grating layer 102. Various embodiments of the ridge waveguide laser can be configured to operate as a single mode laser. In some such embodiments, light emitted from the ridge waveguide laser can comprise a single longitudinal mode and a single traverse mode.

For higher power laser designs, it can be advantageous to increase the width $W_r$ of the ridge 101. Increasing the width $W_r$ of the ridge 101 can advantageously increase the area of current injection and/or reduce resistance and carrier densities required for lasing. Increasing the width $W_r$ of the ridge 101 can also advantageously reduce heating and thermal runaway. However, a wide ridge 101 can support higher order modes. Accordingly, light output from a laser with a wide ridge 101 can include more than one transverse optical mode. In other words, a laser with a wide ridge 101 can be multimode.

Figure 2:
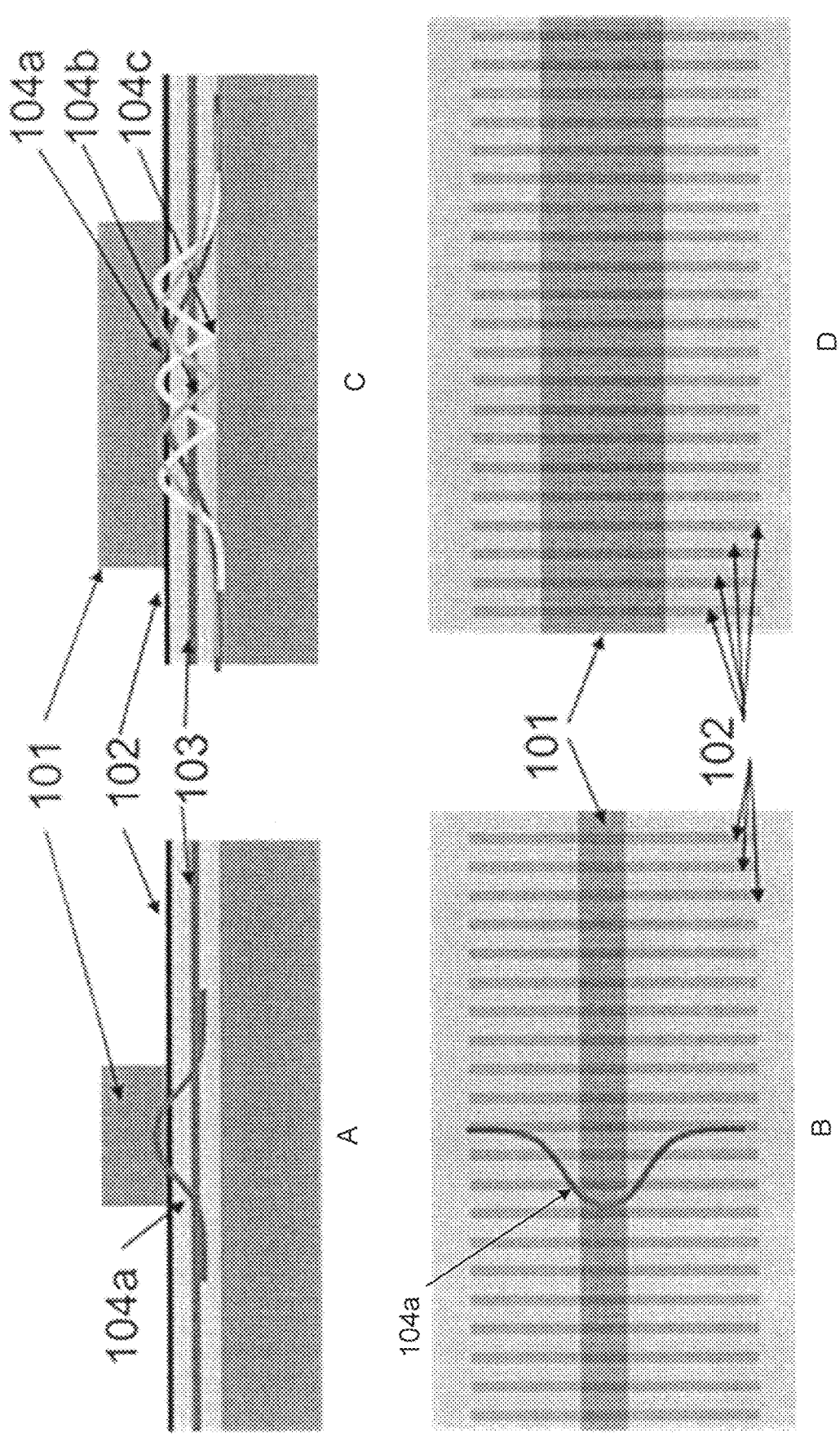
FIG. 2 schematically illustrates two example ridge waveguide lasers with ridges having different ridge widths and the number of transverse optical modes that are supported by the different ridge widths.

FIG. 2 schematically illustrates two example ridge waveguide lasers with ridges 101 having different ridge widths and the number of transverse optical modes that are supported by the different ridge widths. Portions A and B of FIG. 2 schematically illustrate a cross-sectional view (e.g., in the x-y plane) and a top view (e.g., in the x-z plane), respectively, of an example ridge waveguide laser having a ridge 101 with a first width $W_{r1}$ configured to support a single transverse optical mode 104a. In portion B of FIG. 2, the ridge 101 extends from left to right (e.g., along the x-direction) and the grating layer 102 extends along the ridge 101, with the periodic perturbation of the grating layer 102 being parallel to the ridge 101. Portions C and D of FIG. 2 schematically illustrate a cross-sectional view (e.g., in the x-y plane) and a top view (e.g., in the x-z plane), respectively, of an example ridge waveguide laser having a ridge 101 with a second width $W_{r2}$ greater than the first width $W_{r1}$. In portion D of FIG. 2, the ridge 101 extends from left to right (e.g., along the x-direction) and the grating layer 102 extends along the ridge 101. The ridge waveguide laser of portions C and D of FIG. 2 support more than one transverse optical mode 104a-c, and many of the transverse optical modes 104a-c can lase when the structure shown in portions C and D of FIG. 2 is pumped.

For various applications, it can be desirable to have a single mode laser that is configured to output high optical power. Various embodiments of lasers described herein are designed to have wide ridges that are capable of outputting high optical power while simultaneously suppressing transverse higher order optical modes. Some embodiments of lasers with wide ridges can have a modified grating design that can suppress transverse higher order optical modes. In various embodiments of lasers described herein, the grating is designed to have higher interaction with the fundamental mode than with higher order modes. Without subscribing to any particular scientific theory, the fundamental mode can lase at a lower threshold than the other higher order modes that are supported by the wider ridge. The lasing of the fundamental mode at the lower threshold can clamp the carrier density at a level below the carrier density required for the higher order modes that are supported by wider ridge to lase.

Certain embodiments described herein advantageously provide high-power single-mode lasers in which at least one higher order transverse mode is suppressed.

Figure 3:
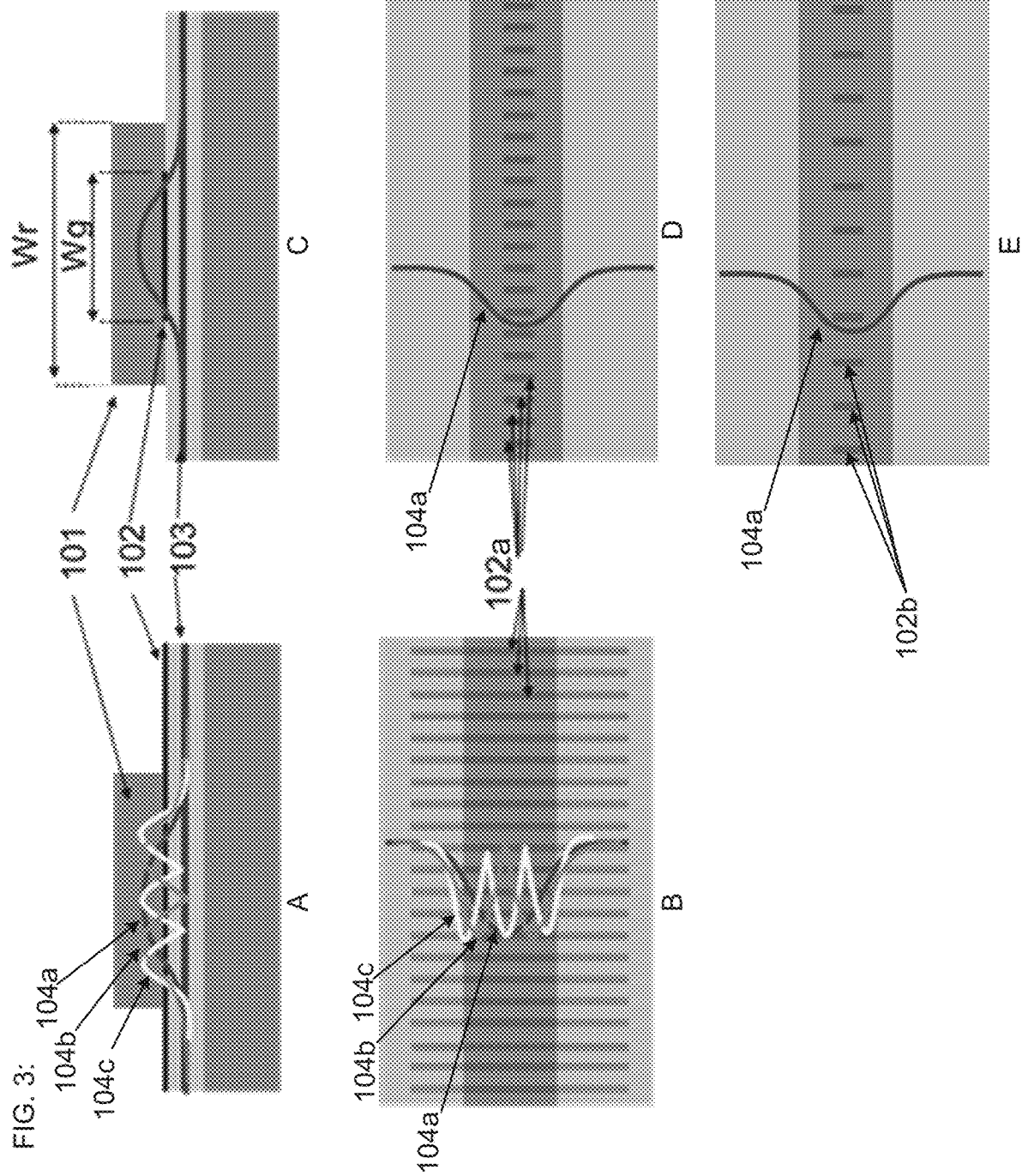
FIG. 3 schematically illustrates example ridge waveguide lasers in accordance with certain embodiments described herein.

FIG. 3 schematically illustrates example ridge waveguide lasers in accordance with certain embodiments described herein. Portions A and B of FIG. 3 schematically illustrate a cross-sectional view (e.g., in the x-y plane) and a top view (e.g., in the x-z plane), respectively, of an example ridge waveguide laser, with a ridge 101 (e.g., having a width $W_r$ in a range of 0.5 micron to 200 microns) and a grating layer 102 that extends across the entire width of the ridge 101 and beyond. The grating layer 102 can comprise first order gratings, sampled gratings, or higher order gratings or other types of gratings. In portion A of FIG. 3, the waveguide layer 103 can support a fundamental transverse optical mode 104a and at least two higher order transverse optical modes 104b,c. Since, the grating layer 102 extends across the width of the ridge 101, the fundamental transverse optical mode 104a and at least two higher order transverse optical modes 104b,c can interact with the grating layer 102. Accordingly, the fundamental transverse optical mode 104a and the at least two higher order transverse optical modes 104b,c can lase when the laser is pumped.

Portions C and D of FIG. 3 schematically illustrate a cross-sectional view (e.g., in the x-y plane) and a top view (e.g., in the x-z plane), respectively, of an example ridge waveguide laser in accordance with certain embodiments described herein. The ridge 101 shown in portions C and D of FIG. 3 has the same width $W_r$ as does the ridge 101 of the example ridge waveguide laser shown in portions A and B of FIG. 3 (e.g., in a range of 0.5 micron to 200 microns). Accordingly, without subscribing to any particular scientific theory, the ridge 101 of the example ridge waveguide laser of portions C and D of FIG. 3 can also support a fundamental transverse optical mode 104a and at least two higher order transverse optical modes 104b,c. However, as schematically illustrated in portions C and D of FIG. 3, the grating layer 102 is patterned to have a width $W_g$ less than the ridge width $W_r$. Accordingly, the grating layer 102 interacts more strongly with the fundamental (or first order) transverse mode 104a than with the other higher order transverse modes 104b,c. In portions C and D of FIG. 3, only the fundamental transverse mode 104a is shown because the interaction of the higher order modes 104b,c with the grating layer 102 can be reduced as a result of the reduction in the width $W_g$ of the grating layer 102. Accordingly, without subscribing to any particular scientific theory, the higher order modes 104b,c can have much higher lasing thresholds as compared to the fundamental (or first order) mode 104a and thus may not lase. In various embodiments, the grating layer 102 can have a width $W_g$ between 1% and about 95% of the width $W_r$ of the ridge 101. In certain other embodiments, other widths can be used.

Portion E of FIG. 3 schematically illustrates a top view (e.g., in the x-z plane) of an example ridge waveguide laser in accordance with certain embodiments described herein. The grating layer 102 comprises at least one higher order grating (e.g., one or more second order gratings 102b). Similar second order gratings on opposite sides of the ridge 101 are shown in and described in connection with FIG. 9. The second order grating 102b can allow some portion of the light in the waveguide layer 103 to be coupled along the vertical direction (e.g., along the y-direction). The portion of the light that is coupled along the vertical direction is diverted from propagating along the ridge 101 and is thus not emitted by the ridge waveguide laser. Accordingly, in certain embodiments, second order gratings 102b can be configured to couple a larger portion of the light in at least one higher order mode 104b,c vertically out of the laser as compared to the first order mode 104a. In this manner, the amount of power in higher order modes 104b,c that is emitted by the laser can be reduced as compared to the amount of power emitted in the first order mode 104a. Accordingly, the combination of the first order gratings 102a and the second order gratings 102b can be used to select a single transverse mode.

Figure 4:
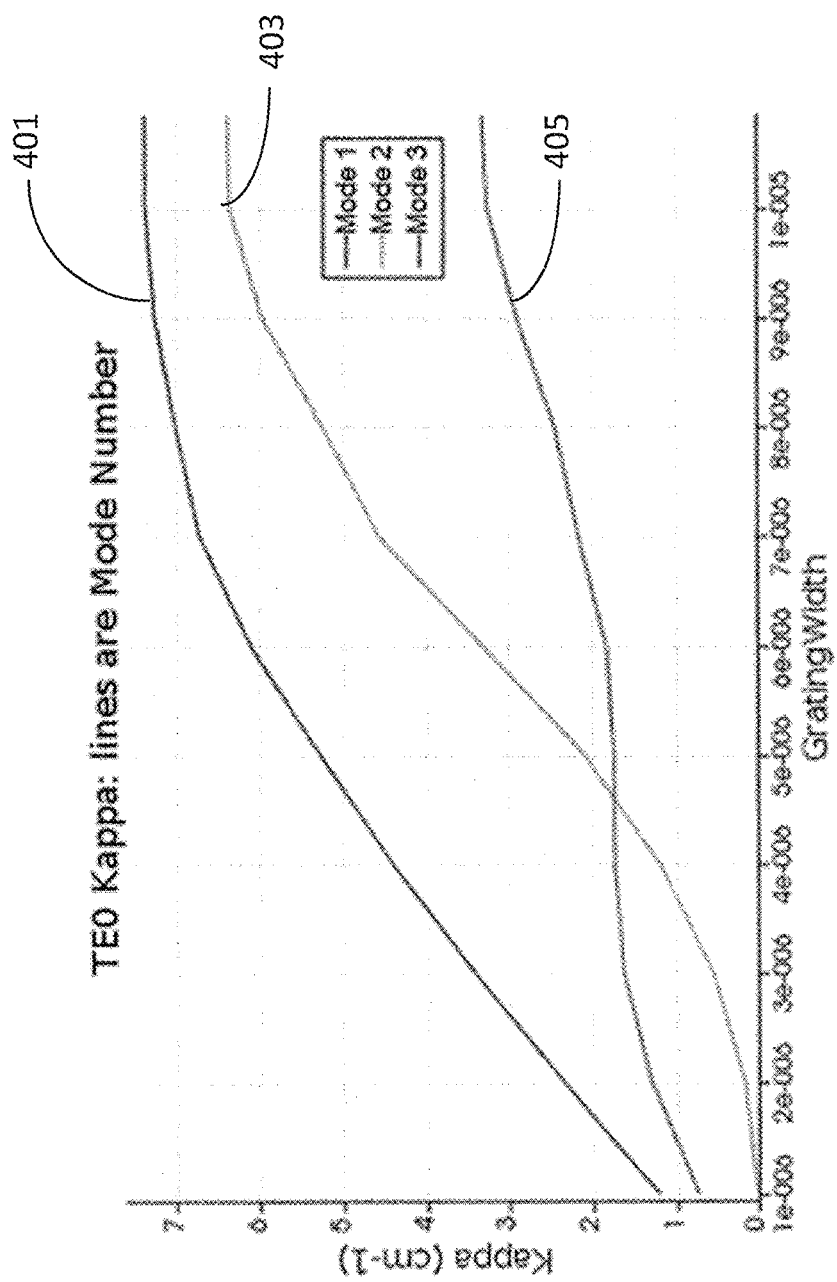
FIG. 4 is a graph showing the variation of grating coupling strength, Kappa, for three different modes with the grating width.

FIG. 4 is a graph that shows the difference in grating coupling strength for different widths of a grating structure for multiple modes that can be supported by a ridge having a width $W_r$ in accordance with certain embodiments described herein. To obtain the graph shown in FIG. 4, the grating coupling strength (e.g., the grating coupling coefficient, Kappa) is calculated for the possible transverse modes (e.g., fundamental (first order) transverse mode depicted by curve 401, the second order transverse mode depicted by curve 403 and the third order transverse mode depicted by curve 405). The grating coupling coefficient, Kappa, is calculated for a ridge 101 having a width $W_r$ of about 10 microns and for different widths of the grating layer 102. FIG. 4 shows that at a grating width $W_g$ of approximately 5 microns, the grating coupling strength for the fundamental (first order) transverse mode (depicted by curve 401) is more than twice than the grating coupling strength for the higher order transverse modes (depicted by curves 403 and 405). When the grating width $W_g$ is 10 microns, the grating coupling strength for the fundamental (first order) mode coupling is only slightly stronger than the grating coupling strength for one of the higher order modes. Accordingly, the higher order transverse modes may begin to lase. The grating coupling strength can be further modified by modifying various grating parameters, such as thickness of the grating layer 102, index of refraction of the grating layer 102, and placement of the grating layer 102 in the epitaxial stack relative to the optical mode (e.g., position of the grating layer 102 with respect to the peak of the optical mode along the y-direction). Accordingly, the grating coupling strength for the fundamental (first order) transverse mode and the other higher order modes can be tailored independently.

In certain embodiments described herein, ridge waveguide laser designs are used to describe the innovative concepts associated with tailoring one or more parameters of the grating to selectively increase the grating coupling strength for one of the transverse optical modes as compared to the other higher order modes to obtain single mode operation of the laser. Other laser designs, including but not limited to the buried heterostructure and other waveguide architectures are also compatible with certain embodiments described herein. The concepts described herein can be used to manufacture a variety of lasers including lasers manufactured using epitaxial growth, waveguide etching, or ion implantation techniques.

Figure 5C:
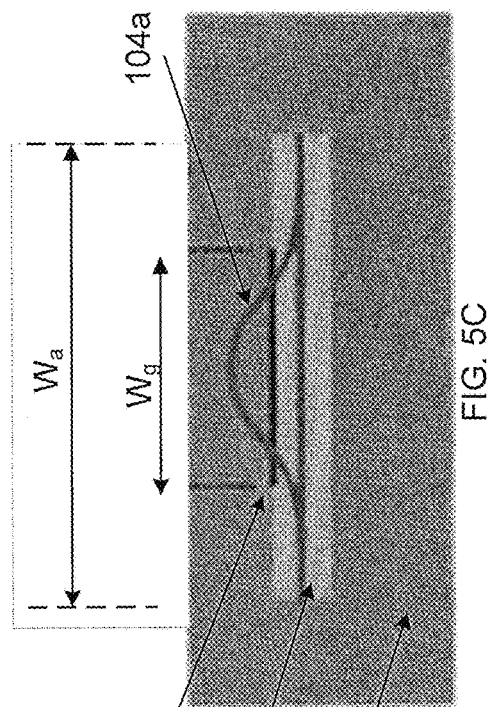
FIGS. 5C-5D schematically illustrate a cross-sectional view and a top view, respectively, of an example buried heterostructure waveguide laser having a grating width less than a width of the active region that supports a single optical mode in accordance with certain embodiments described herein.
Figure 5D:
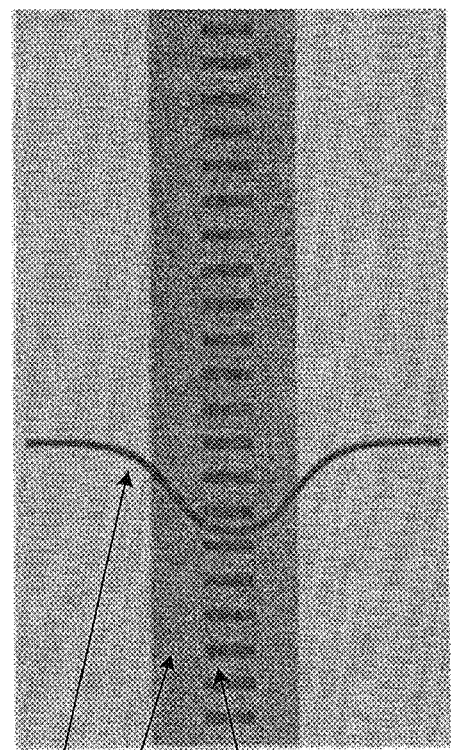
Figure 5A:
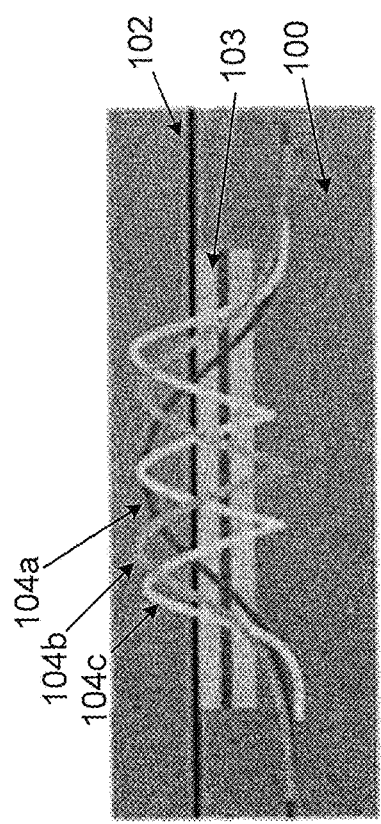
FIGS. 5A-5B schematically illustrate a cross-sectional view and a top view, respectively, of an example buried heterostructure waveguide laser that supports more than one optical mode.
Figure 5B:
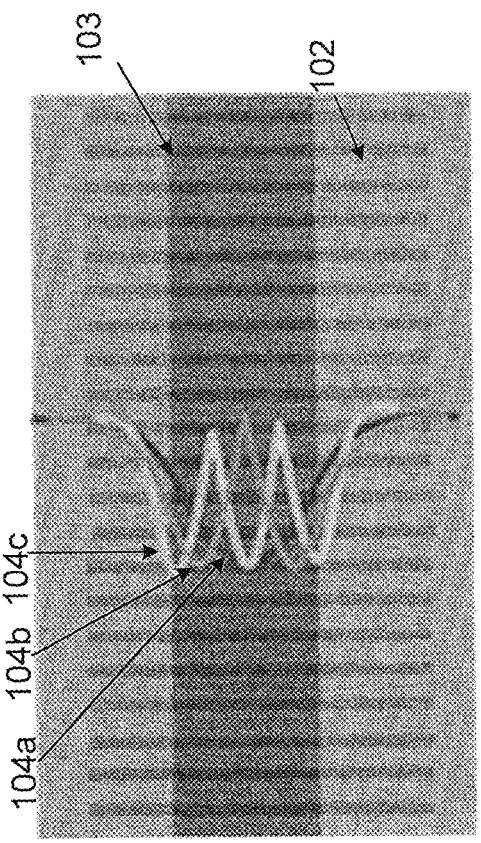

FIGS. 5A-5B schematically illustrate a cross-sectional view (e.g., in the x-y plane) and a top view (e.g., in the x-z plane), respectively, of an example buried heterostructure waveguide laser that supports more than one optical mode. The active region including the waveguide layer 103 is buried in the substrate 100, has a width $W_a$ capable of supporting more than one transverse optical mode, and provides vertical confinement (e.g., along the y-direction of FIG. 5A) of the mode. The grating layer 102 is disposed across the entire width $W_a$ of the active region including the waveguide layer 103. In the example buried heterostructure waveguide laser of FIGS. 5A-5B, the grating layer 102 is wider than the active region and extends beyond the active region (e.g., $W_g > W_a$).

FIGS. 5C-5D schematically illustrates a cross-sectional view (e.g., in the x-y plane) and a top view (e.g., in the x-z plane), respectively, of an example buried heterostructure waveguide laser in accordance with certain embodiments described herein. The grading layer 102 has a grating width $W_g$ less than the width $W_a$ of the active region including the waveguide layer 103. In certain embodiments, as shown in FIGS. 5C-5D, the width $W_g$ of the grating layer 102 is configured to have greater coupling strength with the fundamental (first order) transverse optical mode 104a while the grating coupling strengths for the other higher order transverse optical modes 104b,c are reduced. Accordingly, in various embodiments, only the fundamental (first order) transverse optical mode 104a lases.

In certain embodiments, the ridge 101 of a ridge waveguide laser can be fabricated by disposing a layer of cladding material over the active region comprising the waveguide layer 103 and etching portions of the layer of cladding material to form the ridge 101. In certain such embodiments, the cladding material is etched completely (e.g., down to the active region comprising the waveguide layer 103) from the regions surrounding the ridge 101. However, in certain other embodiments, the etch depth in the regions surrounding the ridge 101 can be reduced. For example, the regions surrounding the ridge 101 can be etched down to a level above the active region comprising the waveguide layer 103 such that a portion of the cladding material surrounding the ridge 101 can remain after etching. The portion of the cladding material surrounding the ridge 101 can be referred as a confinement reduction layer or wings 105. The height $H_w$ of the confinement reduction layer 105 can be smaller than the height $H_R$ of the ridge 101. The confinement reduction layer 105 can advantageously reduce lateral confinement (e.g., along the x-direction) of the lasing modes which can reduce the number of transverse modes in the ridge waveguide laser. Accordingly, the confinement reduction layer 105 can result in fewer transverse modes for a given ridge width $W_r$. In certain embodiments, portions of the confinement reduction layer 105 can be treated with an ion implantation process to increase electrical resistance of the portions of the confinement reduction layer 105. Increasing the electrical resistance can advantageously prevent unwanted current spreading of the injection current beyond the region in the vicinity of the ridge 101 which laterally confines the optical mode. Accordingly, in certain embodiments, portions of the confinement reduction layer 105 that are spaced apart from the ridge 101 by a distance in a range between 0 and 5 microns can be treated with an ion implantation process. The regions for ion implantation can be demarcated by standard lithographic processes using photoresist and or dielectrics, polymers or metals.

Figure 6A:
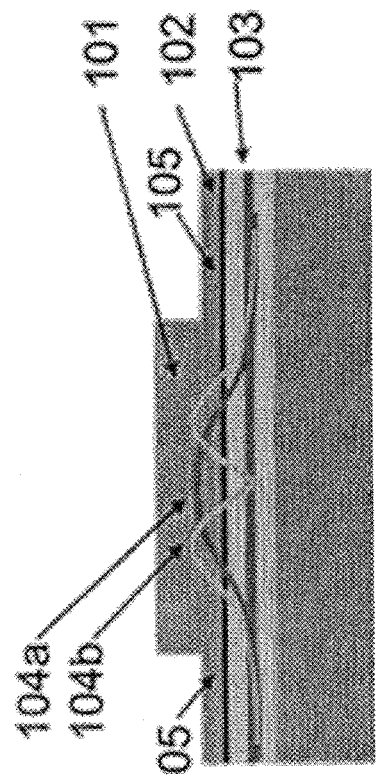
FIG. 6A schematically illustrates a cross-sectional view of an example ridge waveguide laser that supports more than one optical mode.
Figure 6B:
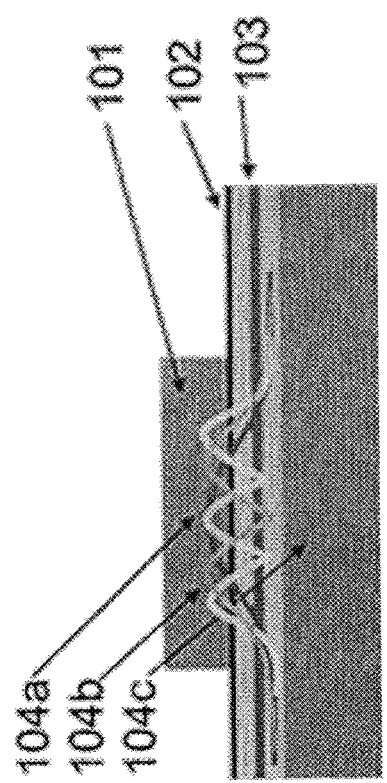
FIG. 6B schematically illustrates a cross-sectional view of an example ridge waveguide laser with wings configured to reduce lateral confinement to reduce the number of transverse optical modes that are supported in accordance with certain embodiments described herein.

FIG. 6A schematically illustrates an example ridge waveguide laser having a ridge width WY that supports more than one optical mode. For example, the ridge waveguide laser of FIG. 6A supports the fundamental mode 104a, the second order mode 104b, and the third order mode 104c. FIG. 6B schematically illustrates an example ridge waveguide laser in accordance with certain embodiments described herein. The example ridge waveguide layer of FIG. 6B comprises a ridge 101 that is surrounded by a confinement reduction layer 105 (e.g., "wings") configured to reduce lateral confinement to reduce the number of transverse optical modes that are supported. In FIG. 6B, the reduced etch depth in the region surrounding the ridge 101 has resulted in the confinement reduction layer 105 next to the ridge 101. The confinement reduction layer 105 of certain embodiments can weaken lateral confinement such that only two of the three modes (e.g., the fundamental mode 104a and the second order mode 104b) are supported, as shown in FIG. 6B. Without subscribing to any particular theory, the lateral confinement in the ridge 101 is provided by the refractive index difference between the material of the ridge 101 and the material of the surrounding medium (e.g., air). The presence of the confinement reduction layer 105 can reduce the refractive index difference, which in turn can reduce lateral confinement.

Figure 6C:
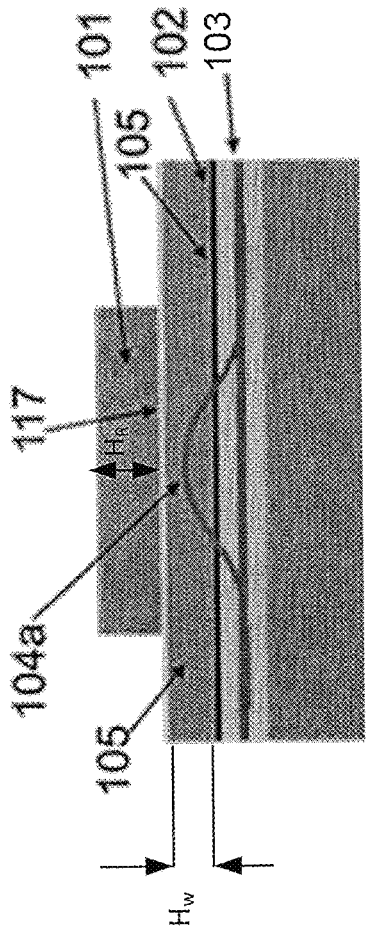
FIG. 6C schematically illustrates a cross-sectional view of an example ridge waveguide laser having a stop etch layer to control the height of the wings in accordance with certain embodiments described herein.
Figure 6D:
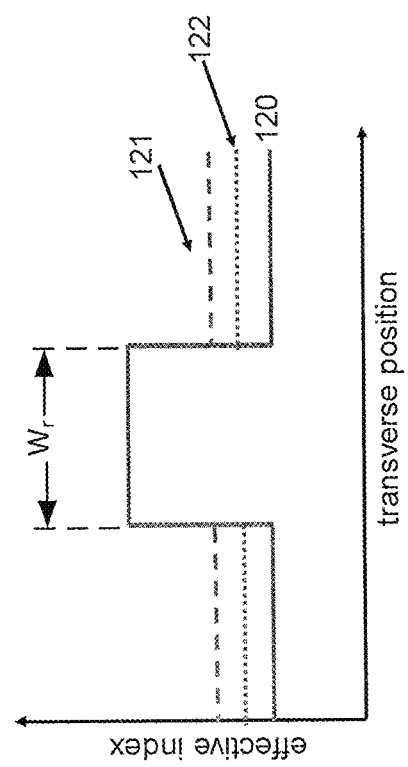
FIG. 6D is a graphical representation of the variation of the effective refractive index in ridge waveguide lasers with wings of different heights.

FIG. 6D shows the variation of the effective refractive index in the ridge 101 having different heights of the confinement reduction layer 105. In FIG. 6D, curve 120 shows the variation of the effective refractive index in the ridge 101 for an example ridge waveguide laser without a confinement reduction layer 105, curve 122 shows the variation of the effective refractive index in the ridge 101 for an example ridge waveguide laser having a confinement reduction layer 105 with a first height $H_{w1}$ less than the height $H_R$ of the ridge 101, and curve 121 shows the variation of the effective refractive index in the ridge 101 for an example ridge waveguide laser having a confinement reduction layer 105 with a second height $H_{w2}$ less than the height $H_R$ of the ridge 101, the second height $H_{w2}$ being greater than the first height $H_{w1}$.

Since the effective refractive index in the ridge 101 decreases as the height of the confinement reduction layer 105 increases, the lateral confinement can reduce as the height of the confinement reduction layer 105 is increased. Accordingly, the height of the confinement reduction layer 105 along the y-direction can be configured to support a single mode (e.g., fundamental mode 104a). Certain embodiments described herein can use the confinement reduction layer 105 to reduce the number of modes supported by the ridge waveguide, and can also use tailoring of the grating design or architecture (e.g., providing gratings with reduced width as discussed herein or the techniques discussed herein) such that a wide ridge 101 can be used to achieve single mode laser output with high optical power.

To manufacture a ridge waveguide laser with the confinement reduction layer 105 as shown in FIG. 6B, the portions of the cladding layer that are not configured to be a ridge 101 can be partially etched to a height above the waveguide layer 103. Accordingly, in certain embodiments, a stop etch layer (or an etch stop layer) 117 can be disposed above the waveguide layer 103. The portion of the cladding layer between the stop etch layer 117 and the waveguide layer 103 becomes the confinement reduction layer 105. The height of the confinement reduction layer 105 can be controlled by positioning the stop etch layer 117 at a desired height above the waveguide layer 103. The grating layer 102 can be disposed above or below the stop etch layer 117. A material selective wet etch can be used to stop precisely on the stop etch layer 117 leaving behind a confinement reduction layer 105 of a desired height. As one possible example, the cladding can comprise indium phosphide (InP) and a stop etch layer 117 comprising InGaAsP can be used to control the height of the confinement reduction layer 105 to tailor the lateral confinement factor of higher order transverse modes such that fewer (e.g., one) transverse optical mode is supported by the ridge waveguide. FIG. 6C schematically illustrates an example ridge waveguide laser comprising a stop etch layer 117 (or etch stop layer) in accordance with certain embodiments described herein. The stop etch layer 117 can be used with an appropriate etch (e.g., wet etch) to achieve a confinement reduction layer 105 having a desired height. The appropriate etch (e.g. wet etch) can selectively remove the substrate 100 and stop on the stop etch layer 117 above the confinement reduction layer 105.

In certain embodiments, the grating can be used to selectively stimulate the one of the several transverse modes (e.g., the fundamental mode) supported by the waveguide layer 103 and can make use of modified grating architectures to further suppress higher order modes. In the examples schematically illustrated by the portions C and D of FIG. 3, the width $W_g$ of the grating layer 102 is modified such that it interacts more (e.g., overlaps better) with the fundamental (or first order) mode 104a than with the other higher order transverse modes 104b,c.

FIGS. 7A-7B schematically illustrate a cross-sectional view (e.g., in the x-y plane) and a top view (e.g., in the x-z plane), respectively, of an example ridge waveguide laser in accordance with certain embodiments described herein, and FIG. 7C graph showing the variation of grating coupling strength, Kappa, for three different modes for the example ridge waveguide laser of FIGS. 7A-7B. The example ridge waveguide laser of FIGS. 7A-7B comprises a primary grating layer 102 having a width $W_g$ that is less than the width $W_r$ of the ridge 101 (see, e.g., portions C and D of FIG. 3). The primary grating layer 102 is disposed in the central region of the ridge 101 so that the coupling efficiency (e.g., Kappa) of the primary grating layer 102 for the fundamental (or first order) mode 104a is greater than the coupling efficiency for the other higher order modes 104b,c. The example ridge waveguide laser schematically illustrated in FIGS. 7A-7B additionally comprises a secondary grating layer 106 comprising secondary gratings that are configured to reduce the net index change provided by the primary grating layer 102 and the secondary grating layer 106 to the higher order modes. In certain embodiments, this reduction of the net index change can be accomplished by providing a secondary grating layer 106 having grating elements that are configured to be out-of-phase with the grating elements of the primary grating layer 102.

For example, the grating elements of the secondary grating layer 106 can be aligned with the spaces between the grating elements of the primary grating layer 102 as shown in FIG. 7B. Without relying on any particular theory, the higher order modes experience a periodic increase and decrease in refractive index (RI) from the grating elements of the primary grating layer 102 and the secondary grating layer 106. The periodic increase and decrease in RI from the grating elements of the primary grating layer 102 are out-of-phase with the periodic increase and decrease in RI from the grating elements of the secondary grating layer 106 when the grating elements of the secondary grating layer 106 are disposed such that they are out-of-phase with the primary grating layer 102. Thus, for the higher order modes, increase in the RI from the grating elements of the primary grating layer 102 are reduced by the decrease in RI from the grating elements of the secondary grating layer 106. This reduction in the net RI change can cause the lasing threshold to increase for the higher order modes. In the illustrated embodiment, the secondary grating layer 106 can comprise two sections disposed near the edges of the ridge 101. In other embodiments, the secondary gratings of the secondary grating layer 106 can comprise one section or more than two sections. The secondary grating layer 106 is disposed such that the secondary grading has less interaction (e.g., less overlap) with the fundamental (first order) mode 104a, as shown in FIGS. 7A-7C, which is mostly confined in the central region of the ridge 101. However, the interaction (e.g., overlap) of the higher order modes 104b,c with the grating elements of the secondary grating layer 106 is of the same order of magnitude as the interaction (e.g., overlap) of the higher order modes 104b,c with the grating elements of the primary grating layer 102. In certain embodiments in which the grating elements of the secondary grating layer 106 are configured to be out of phase, their effect is to minimize or reduce the index change or the net grating strength experienced by the higher order modes. For example, the index change provided by the grating elements of the primary grating layer 102 for the higher order modes can be canceled or reduced by the index change provided by the grating elements of the secondary grating layer 102 for the higher order modes. In certain embodiments, the contributions of the grating elements of the primary grating layer 102 and the secondary grating layer 106 can cancel each other out. Another way of considering the effect of the gratings of certain embodiments is that the reflections from the grating elements of the primary grating layer 102 are out of phase with the reflections from the grating elements of the secondary grating layer 106. Accordingly, the reflections from the grating elements of the secondary grating layer 106 can reduce or cancel the reflections from the grating elements of the primary grating layer 102.

Figure 8:
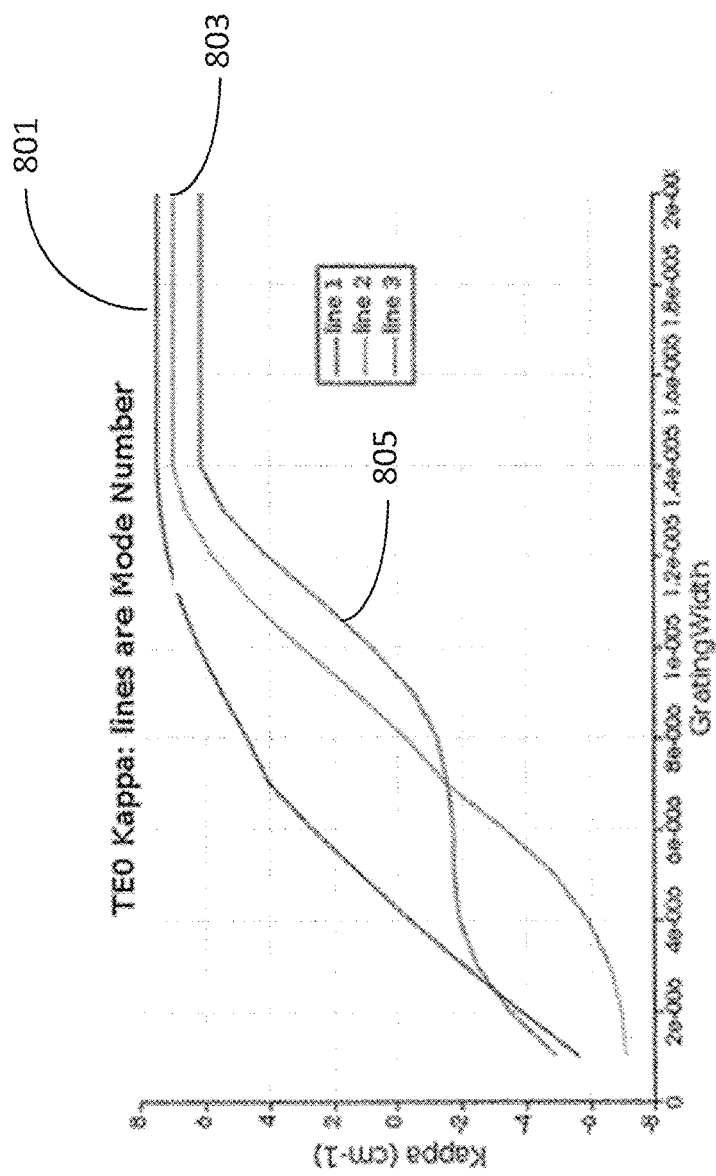
FIG. 8 is a graph showing the variation of coupling strength for three different modes with the grating width for the example ridge waveguide laser of FIG. 7A.

FIG. 8 is a graph that shows the difference in coupling strength for different widths of the primary grating layer 102 for three different modes that can be supported by a ridge having a width $W_r$ for the example ridge waveguide laser of FIG. 7A. To obtain the graph shown in FIG. 8, the coupling coefficient Kappa is calculated for a ridge waveguide laser having a ridge width $W_r$ of about 14 microns that can support at least three transverse modes (e.g., curve 801 for the fundamental (first order) transverse mode, curve 803 for the second order transverse mode, and curve 805 for the third order transverse mode). The example ridge waveguide laser corresponding to FIG. 8 has a primary grating layer 102 disposed in the central region of the ridge 101 and a secondary grating layer 106 disposed near the edges of the ridge 101, as discussed herein with reference to FIGS. 7A-7C. As seen in FIG. 8, in certain embodiments in which the width of the primary grating layer 102 is about 9 microns, the net coupling coefficient for the fundamental (or first order) mode is about 6 cm$^{-1}$, while the net coupling coefficient for the second order transverse mode is 1 cm$^{-1}$, and the net coupling coefficient for the third order transverse mode is −1 cm$^{-1}$. Thus, by tailoring the width of the primary grating layer 102, the relative coupling for a desired optical mode can be selected to be higher than the coupling strength for other modes.

Figure 9:
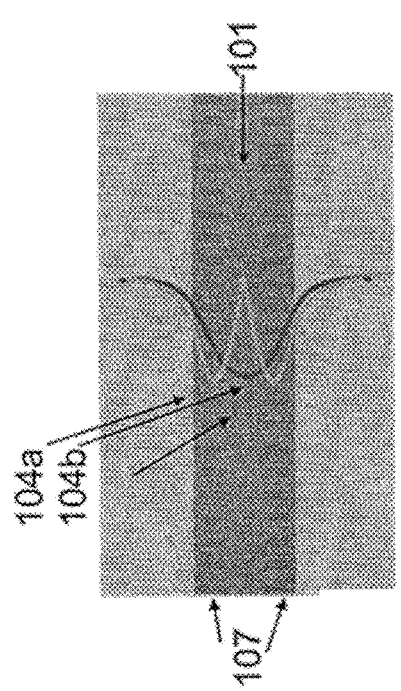
FIG. 9 schematically illustrates a top view of an example ridge waveguide laser having a grating structure configured to select a second order mode in accordance with certain embodiments described herein.

In certain embodiments, the tailoring of the primary grating layer 102 and/or the secondary grating layer 106 can be applied to select the second order transverse mode, as shown in FIG. 8. FIG. 9 schematically illustrates a top view (e.g., in the x-z plane) of an example ridge waveguide laser comprising a grating structure 107 that is configured to have more interaction (e.g., overlap) with the second order mode than the first order mode in accordance with certain embodiments described herein. Accordingly, the coupling strength of the second order mode with the grating structure 107 can be higher than the coupling strength of the grating structure 107 with the first order mode (e.g., thereby selecting the second order mode). In certain embodiments, as schematically illustrated in FIG. 9, the grating structure 107 comprises two sections, with each section disposed near an edge of the ridge 101. There is no grating structure in the central region of the ridge 101 where the first order mode 104a has its maximum intensity. Grating structures 107 such as these can be used in certain embodiments to make the second order mode 104b lase while suppressing lasing of other modes, including the fundamental mode 104a. In certain other embodiments, the grating structure 107 in FIG. 9 can be higher order, such as a second order grating with 50% duty cycle, so as to selectively scatter light out of the waveguide layer 103. In certain such embodiments, the high loss induced by the grating structure 107 on the second order mode 104b can prevent the second order mode 104b from lasing, and the fundamental mode 104a can lase between the two reflective facets of the laser. Without any loss of generality, the duty cycle of the second order grating structure can have a duty cycle in a range between about 30% and about 70% (e.g., between about 35% and about 65%, between about 40% and about 60%, between about 45% and about 55%, between about 48% and about 52% or any value in a range/sub-range defined by values between 30% and 70%).

Other embodiments can employ other grating designs that are configured to have a higher grating coupling coefficient for one transverse mode as compared to other transverse modes that are supported. For example, the example ridge waveguide laser schematically illustrated by FIGS. 7A-7B has a primary grating layer 102 disposed in the central region of the ridge 101 and a secondary grading layer 106 comprising two secondary gratings offset in phase from the primary grating of the primary grating layer 106 and disposed in the edge portions of the ridge 101. In certain other embodiments, additional secondary grating layers 106 and/or additional secondary grading structures (e.g., comprising three, four, five or more lines of gratings) can be employed to allow single mode lasing ridges that are wider than the ridge 101 shown in FIGS. 7A-7B.

Figure 10:
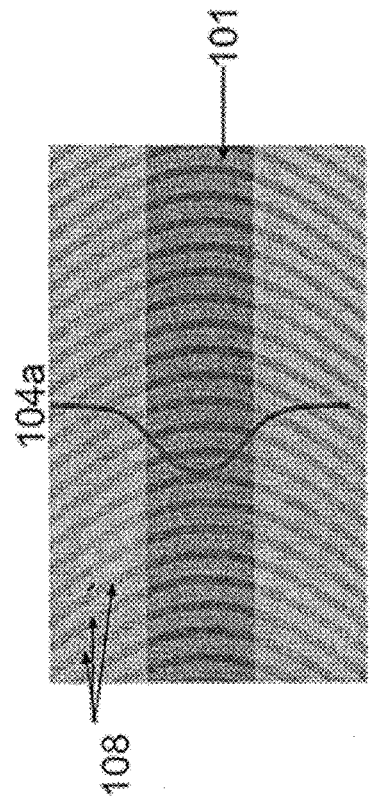
FIG. 10 schematically illustrates a top view of an example ridge waveguide laser comprising curved grating structures in accordance with certain embodiments described herein.

In certain embodiments, curved gratings can be employed to increase grating coupling efficiency of one transverse mode as compared to other transverse modes. FIG. 10 schematically illustrates a top view (e.g., in the x-z plane) of an example ridge waveguide laser having curved grating structures 108 in accordance with certain embodiments described herein. The curved grating structures 108 can be configured to increase coupling efficiency for the fundamental (first order) mode 104a. The curved grating structures 108 can also potentially result in guiding of the beam. For example, without subscribing to any particular scientific theory, the curved grating structures 108 can be configured such that for higher order modes, the reflections from the edge portions of the curved grating structures 108 are out-of-phase with respect to the reflections from central portion of the curved grating structures 108 to reduce the net grating coupling coefficient.

The concepts discussed herein can be applied to a variety of lasers in addition to the ridge waveguide lasers and buried heterostructure type of lasers. For example, the concepts discussed herein can be applied to lasers with deeply etched waveguides, buried ridge stripe architectures, laser with gain guided waveguides, and any other waveguide structure where higher order transverse modes can be supported as the width of the waveguide increases.

Figure 11:
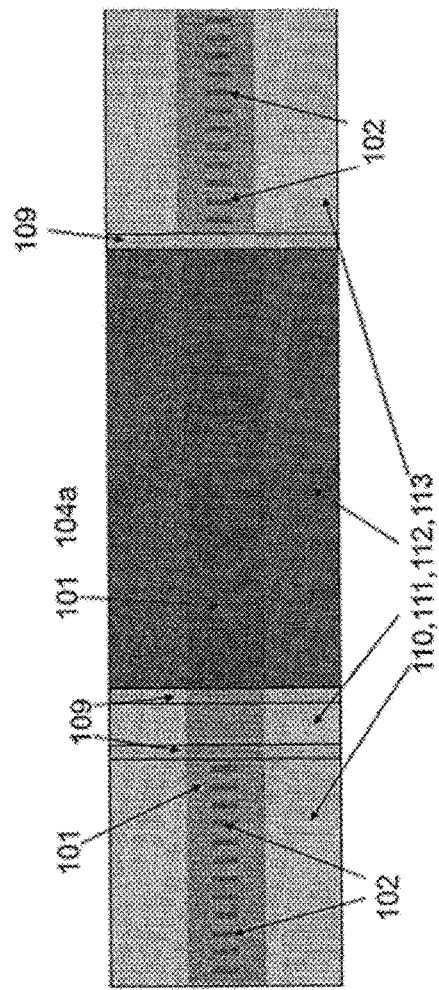
FIG. 11 schematically illustrates a top view of an example distributed Bragg reflector (DBR) laser with a grating structure having a width less than a width of the ridge in accordance with certain embodiments described herein.

Certain embodiments are described herein with reference to distributed feedback (DFB) laser architectures where the active region and the grating elements are coexistent. However, certain other embodiments can apply the concepts discussed herein equally well to other structures, such as distributed Bragg reflector (DBR) lasers and sampled grating DBR (SGDBR) lasers which have passive or tunable mirrors at either end of a gain section. For example, FIG. 11 schematically illustrates, a top view (e.g., in the x-z plane) of an example distributed Bragg reflector (DBR) laser with a grating reflector and a grating structure having a width less than a width of the ridge in accordance with certain embodiments described herein. The example DBR laser of FIG. 11 comprises a laser gain section 112 inside a laser cavity formed by the two mirror sections 110, 113. The mirror sections 110, 113 can be DBR or SGDBR type grating reflectors. Alternatively, in certain embodiments, just one of the mirrors 110, 113 can be grating-based and the other mirror 110, 113 can be a broadband reflector (e.g., such as that provided by a cleaved facet or by a ring resonator or other type of reflector). In certain embodiments, electrical isolation regions 109 can be present between laser sections and in certain embodiments, a phase section 111 can be present for tuning cavity modes. The grating layer 102 can be tailored to preferentially select a single mode at one or both mirrors 110, 113, in accordance with certain embodiments described herein.

In certain embodiments, lasers designed according to the concepts discussed herein comprising a grating preferentially configured to select a single transverse mode for lasing can also be integrated with other components in a monolithic architecture. For example, the laser can be monolithically integrated with a semiconductor optical amplifier (SOA), a Mach-Zehnder modulator, and/or an electro-absorption modulator. In certain embodiments, the laser can also be included in a master oscillator power amplifier (MOPA) configuration, either as a DFB or a DBR laser in which the fundamental mode is preferentially selected for injection into the power amplifier. In certain embodiments, lasers comprising a grating preferentially configured to select a single transverse mode for lasing in accordance with certain embodiments described herein can be coupled to a passive optical component, such as, for example, optical mode converters.

Figure 12A:
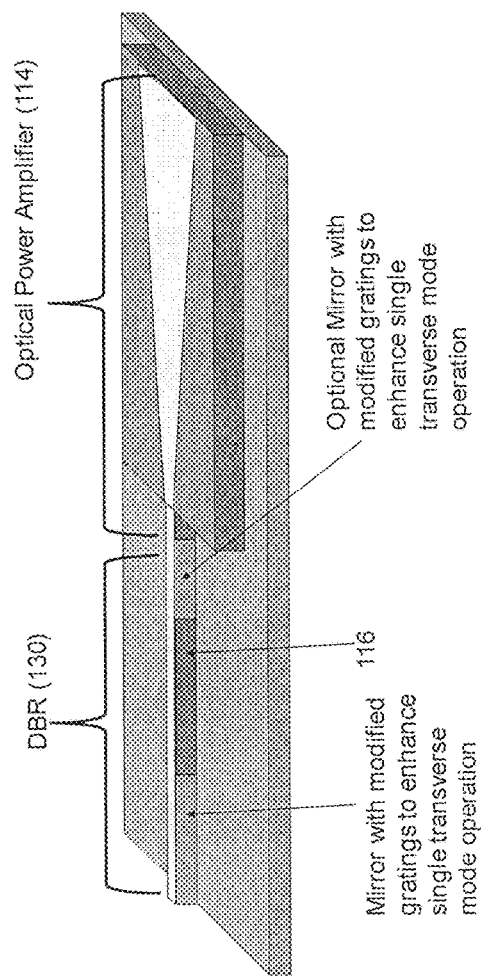
FIGS. 12A-12B schematically illustrate a perspective view and a top view, respectively, of an example distributed Bragg reflector (DBR) laser optically coupled to an optical amplifier in accordance with certain embodiments described herein.
Figure 12B:
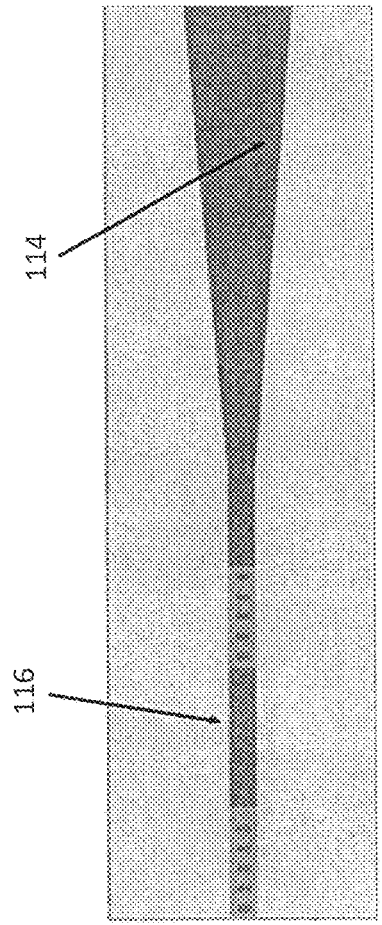

For example, FIGS. 12A-12B schematically illustrate a perspective view and a top view, respectively, of an example distributed Bragg reflector (DBR) laser 130 optically coupled to an optical amplifier 114 in accordance with certain embodiments described herein. The DBR laser 130 comprises an active region 116 which can comprise a waveguide layer. The active region 116 comprising a waveguide layer can be bounded by at least one reflector comprising a grating. The width of the grating in the at least one reflector can have a width less than the width of the waveguide layer to increase grating coupling coefficient of the fundamental mode as compared to other higher order modes so as to enhance single transverse mode operation in accordance with certain embodiments described herein.

For another example, FIGS. 13A-13B schematically illustrate a perspective view and a top view, respectively, of an example distributed feedback (DFB) laser 132 optically coupled to an optical amplifier 114 in accordance with certain embodiments described herein. The DFB laser 132 can be a ridge waveguide laser comprising an active layer including a waveguide layer 115, a grating layer 102, and a ridge 101 in accordance with certain embodiments described herein. In certain embodiments, a width of the grating layer 102 can be smaller than the width of the ridge 101 to increase the grating coupling coefficient of the fundamental mode as compared to the grating coupling coefficients of other higher order modes.

Figure 13C:
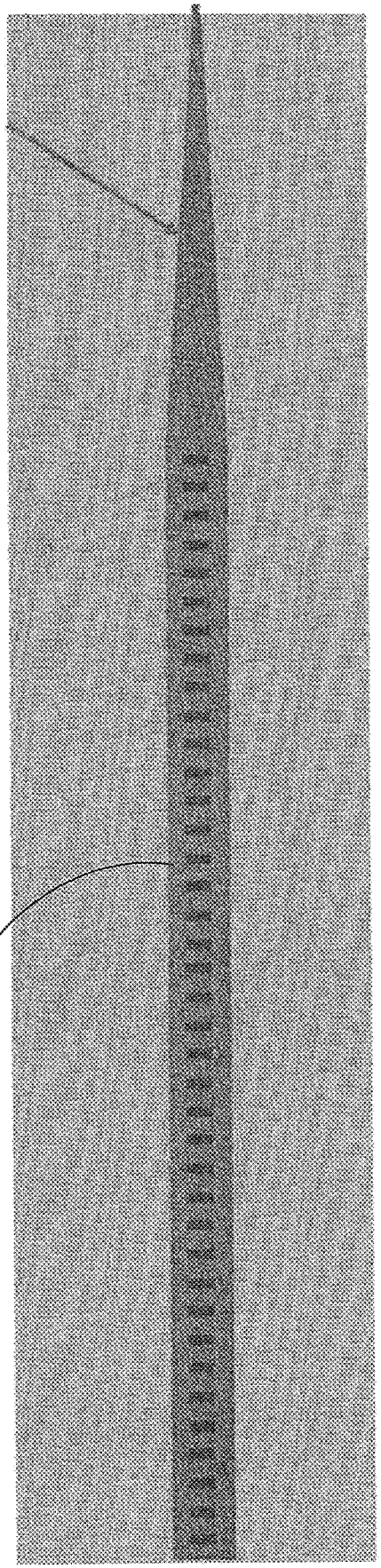
FIG. 13C schematically illustrates a top view of an example DFB laser optically coupled to a tapered waveguide in accordance with certain embodiments described herein.

FIG. 13C schematically illustrates a top view of an example DFB laser optically coupled to a tapered waveguide 151 in accordance with certain embodiments described herein. The DFB laser can be a ridge waveguide laser comprising an active layer including a waveguide layer 115, a grating layer 102, and a ridge 101, in accordance with certain embodiments described herein. In certain embodiments, a width of the grating layer 102 can be smaller than the width of the ridge 101 to increase the grating coupling coefficient of the fundamental mode as compared to the grating coupling coefficients of other higher order modes. In certain embodiments, the tapered waveguide layer 151 of the DFB laser is configured to channel light output from the single mode laser comprising a wide ridge down to a smaller waveguide. For example, the taper can be configured to couple light from a waveguide layer having a width in a range between 0.004 mm and 0.5 mm into a waveguide layer having a width in a range between 0.0001 mm and 0.05 mm. In certain embodiments, the tapered waveguide layer 151 can be configured to channel light from a first waveguide layer having a first width into a second waveguide layer having a second width less than the first width. For example, the second width can be 90% of the first width, 80% of the first width, 70% of the first width 60% of the first width, 50% of the first width, 40% of the first width, 33% of the first width, 30% of the first width, 25% of the first width, 20% of the first width or 10% of the first width, or can be in a range between any two of these values.

In certain embodiments described herein, the average effective refractive index provided by the grating layer 102 can be either higher than or lower than the average refractive index in the area surrounding the grating layer 102. The average effective refractive index provided by the grating layer 102 can be tailored by choosing materials with desired values of refractive index and/or using negative or positive grating fabrication processes. For example, the average effective refractive index provided by the grating layer 102 can be tailored by manufacturing the grating layer 102 using positive or negative masks and/or using positive or negative photoresists. Without any loss of generality, a grating structure fabricated using a positive mask can result in grating features having a higher refractive index than a refractive index of the surrounding region. Without any loss of generality, a grating structure fabricated using a negative mask can result in grating features having a lower refractive index than the refractive index of the surrounding region.

While the foregoing detailed description discloses several embodiments of the present invention, it should be understood that this disclosure is illustrative only and is not limiting of the present invention. It should be appreciated that the specific configurations and operations disclosed can differ from those described herein, and that the apparatus and methods described herein can be used in various contexts. Additionally, components can be added, removed, and/or rearranged. Additionally, processing steps can be added, removed, or reordered. A wide variety of designs and approaches are possible.

Various modifications to the embodiments described herein may be readily apparent to those skilled in the art, and the generic principles defined herein can be applied to other embodiments without departing from the spirit or scope of this disclosure. Thus, the claims are not intended to be limited to the embodiments shown herein, but are to be accorded the widest scope consistent with this disclosure, the principles and the novel features disclosed herein. The word "exemplary" is used exclusively herein to mean "serving as an example, instance, or illustration." Any embodiment described herein as "exemplary" is not necessarily to be construed as preferred or advantageous over other embodiments. Additionally, a person having ordinary skill in the art will readily appreciate, the terms "upper" and "lower" are sometimes used for ease of describing the figures, and indicate relative positions corresponding to the orientation of the figure on a properly oriented page, and may not reflect the proper orientation of the device as implemented.

Certain features that are described in this specification in the context of separate embodiments also can be implemented in combination in a single embodiment. Conversely, various features that are described in the context of a single embodiment also can be implemented in multiple embodiments separately or in any suitable subcombination. Moreover, although features may be described herein as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Further, the drawings may schematically depict one more example processes in the form of a flow diagram. However, other operations that are not depicted can be incorporated in the example processes that are schematically illustrated. For example, one or more additional operations can be performed before, after, simultaneously, or between any of the illustrated operations. In certain circumstances, multitasking and parallel processing may be advantageous. Moreover, the separation of various system components in the embodiments described herein should not be understood as requiring such separation in all embodiments, and it should be understood that the described program components and systems can generally be integrated together in a single software product or packaged into multiple software products. Additionally, other embodiments are within the scope of the following claims. In some cases, the actions recited in the claims can be performed in a different order and still achieve desirable results.

What is claimed:

1. A laser comprising:
    a substrate comprising:
        an active layer comprising a waveguide, the active layer configured to support a fundamental optical mode and at least one higher order transverse optical mode;
        at least one primary grating structure;
        a ridge over the active layer comprising the waveguide, the ridge having a width $W_r$, the ridge comprising a material having a first refractive index lower than a second refractive index of the waveguide;
        at least one secondary grating structure disposed in an edge portion of the ridge spaced apart from the at least one primary grating structure,
        wherein reflection of light from the at least one secondary grating structure is configured to be out of phase with reflection of light from the at least one primary grating structure, and
        wherein a coupling coefficient of the at least one primary grating structure to the fundamental optical mode is greater than a coupling coefficient of the at least one primary grating structure to the at least one higher order transverse optical mode.

2. The laser of claim 1, wherein the at least one primary grating structure has a width $W_g$ less than the width of the ridge $W_r$.

3. The laser of claim 1, wherein the at least one primary grating structure is disposed in a central region of the ridge.

4. The laser of claim 1, wherein the at least one primary grating structure is between the active layer and the ridge.

5. The laser of claim 1, further comprising a confinement reduction layer surrounding the ridge, the confinement reduction layer having a height smaller than a height of the ridge, the confinement reduction layer comprising a material having a third refractive index lower than the second refractive index of the waveguide.

6. The laser of claim 5, wherein a height of the confinement reduction layer is configured to reduce lateral confinement for some of the at least one higher order transverse optical mode.

7. The laser of claim 1, wherein the at least one primary grating structure has a width $W_g$ less than a width of the active layer $W_a$.

8. The laser of claim 1, wherein the at least one primary grating structure comprises a curved grating.

9. An optical device comprising:
    a waveguide layer configured to support a fundamental optical mode and at least one higher order transverse optical mode; and at least one grating structure comprising a plurality of parallel grating structures configured to preferentially select a single transverse optical mode, wherein a coupling coefficient of at least one of the plurality of parallel grating structures to the fundamental optical mode is greater than a coupling coefficient of the at least one of the plurality of parallel grating structures to the at least one higher order transverse optical mode, and wherein different grating structures from the plurality of parallel grating structures have a phase difference.

10. The optical device of claim 9, further comprising an active region including the waveguide layer.

11. The optical device of claim 10, wherein the at least one of the plurality of parallel grating structures is within the active region.

12. The optical device of claim 10, wherein the at least one of the plurality of parallel grating structures is below the active region.

13. The optical device of claim 9, wherein a width $W_g$ of the at least one of the plurality of parallel grating structures is configured such that the coupling coefficient of the fundamental optical mode to the at least one of the plurality of parallel grating structures is greater than the coupling coefficient of the at least one higher order transverse optical mode to the at least one of the plurality of parallel grating structures.

14. The optical device of claim 9, wherein a width $W_g$ of the at least one of the plurality of parallel grating structures is configured such that the coupling coefficient of one transverse optical mode to the at least one of the plurality of parallel grating structures is greater than the coupling coefficient of other transverse optical modes to the at least one of the plurality of parallel grating structures.

15. The optical device of claim 12, further comprising a ridge over the waveguide, the ridge having a width $W_r$, wherein the ridge comprises a material having a first refractive index lower than a second refractive index of the waveguide.

16. The optical device of claim 15, further comprising a confinement reduction layer surrounding the ridge, wherein a distance of a top surface of the confinement reduction layer from the waveguide layer is less than a distance of a top surface of the ridge from the waveguide.

17. The optical device of claim 16, wherein the confinement reduction layer is configured to reduce a number of transverse optical modes.

18. The optical device of claim 9 further comprising a semiconductor.

19. The optical device of claim 9, wherein the waveguide layer comprises at least one of a ridge waveguide, a buried heterostructure, a buried stripe or an in-plane semiconductor waveguide.

20. The optical device of claim 9, wherein at least one of the plurality of parallel grating structures comprises grating elements that are configured to diffract light in one or more transverse optical modes along a direction normal to a top surface of a ridge over the waveguide layer such that light in the one or more transverse optical modes is not coupled out of the laser.

21. The optical device of claim 9, wherein the optical device comprises at least one of a distributed feedback (DFB) laser, a distributed Bragg reflector (DBR) laser, a sampled grating DBR laser, a semiconductor optical amplifier, an electro-absorption modulator, a Mach-Zehnder modulator, a flared optical power amplifier or a tapered waveguide.

22. The optical device of claim 9, wherein the waveguide layer comprises the at least one grating structure.

23. The optical device of claim 9, wherein the waveguide layer comprises silicon on insulator, silicon on doped glass, or silicon nitride (SiN).

24. The optical device of claim 9, wherein at least one of the plurality of parallel grating structures is configured to couple preferentially to one or more higher order transverse optical modes than the fundamental optical mode.

25. The optical device of claim 9, wherein at least one of the plurality of parallel grating structures comprises a second order grating having a 50% duty cycle configured to increase optical loss for higher order transverse optical modes as compared to the fundamental optical mode so that the fundamental optical mode is preferentially selected to laser.

26. The optical device of claim 9, wherein the waveguide layer comprises at least one of a ridge waveguide, a buried heterostructure, a ridge waveguide etched completely through the active region, or any other waveguide architecture suitable for propagating a laser mode.

27. The optical device of claim 9, further comprising an additional etch-stop layer configured to allow selective etching of a cladding layer provided over the waveguide layer to obtain a ridge and a confinement reduction layer.

28. The optical device of claim 27, wherein a thickness of the confinement reduction layer is controlled by a position of the etch-stop layer.

29. The optical device of claim 28, wherein one or more regions of the confinement reduction layer have a higher electrical resistance than at least one other region of the confinement reduction layer.

30. The optical device of claim 9, wherein an average effective refractive index in the at least one grating structure is either higher or lower than an average refractive index in areas surrounding the at least one grating structure.

* * * * *